(12) United States Patent
Kerr et al.

(10) Patent No.: US 7,176,781 B2
(45) Date of Patent: Feb. 13, 2007

(54) STRUCTURE AND METHOD FOR ADJUSTING INTEGRATED CIRCUIT RESISTOR VALUE

(75) Inventors: Daniel Charles Kerr, Orlando, FL (US); Roger W. Key, Orlando, FL (US); Bradley J. Albers, Dallas, TX (US); William A. Russell, Orlando, FL (US); Alan Sangone Chen, Windermere, FL (US)

(73) Assignee: Agere Systems Inc, Allentown, PA (US)

( * ) Notice: Subject to any disclaimer, the term of this patent is extended or adjusted under 35 U.S.C. 154(b) by 176 days.

(21) Appl. No.: 10/953,478

(22) Filed: Sep. 29, 2004

(65) Prior Publication Data

US 2006/0087401 A1 Apr. 27, 2006

(51) Int. Cl.
*H01C 1/012* (2006.01)
(52) U.S. Cl. .................. 338/309; 338/202; 338/322
(58) Field of Classification Search ............ 338/48, 338/67, 115, 308–309, 312, 322; 257/536–539; 438/634, 637; 29/852; 361/792, 795
See application file for complete search history.

(56) References Cited

U.S. PATENT DOCUMENTS

| 4,146,322 | A | | 3/1979 | Shimizu et al. | |
|---|---|---|---|---|---|
| 4,298,856 | A | | 11/1981 | Schuchardt | |
| 5,057,964 | A | | 10/1991 | Bender et al. | |
| 5,206,623 | A | | 4/1993 | Rochette et al. | |
| 6,069,398 | A | | 5/2000 | Kadosh et al. | |
| 6,090,703 | A | * | 7/2000 | Bandyopadhyay et al. | . 438/634 |
| 6,130,571 | A | | 10/2000 | Yamamoto | |
| 6,229,428 | B1 | | 5/2001 | Lai | |
| 6,388,863 | B1 | * | 5/2002 | Horie | 361/303 |
| 6,770,949 | B1 | | 8/2004 | Eltoukhy | 257/536 |
| 6,848,178 | B2 | * | 2/2005 | Kondo et al. | 29/852 |

FOREIGN PATENT DOCUMENTS

| JP | 57-72363 | 5/1982 |
|---|---|---|
| JP | 57-72364 | 5/1982 |

OTHER PUBLICATIONS

European Search Report, Dated Dec. 23, 2005.

* cited by examiner

*Primary Examiner*—Tu Hoang

(57) ABSTRACT

A resistor formed on a material layer of a semiconductor integrated circuit and a method for forming the resistor. The resistor comprises a region of resistive material with a plurality of conductive contacts or plugs in electrical contact with and extending away from the resistive material. A first and a second interconnect line are formed overlying the plugs and in conductive contact with one or more of the plurality of plugs, such that a portion of the resistive material between the first and the second interconnect lines provides a desired resistance. According to a method of the present invention, the plurality of conductive contacts are formed using a first photolithographic mask and the first and the second interconnect lines are formed using a second photolithographic mask. The desired resistance is changed by modifying the first or the second mask such that one or more dimensions of a region of the resistive material between the first and the second interconnect lines is altered.

27 Claims, 8 Drawing Sheets

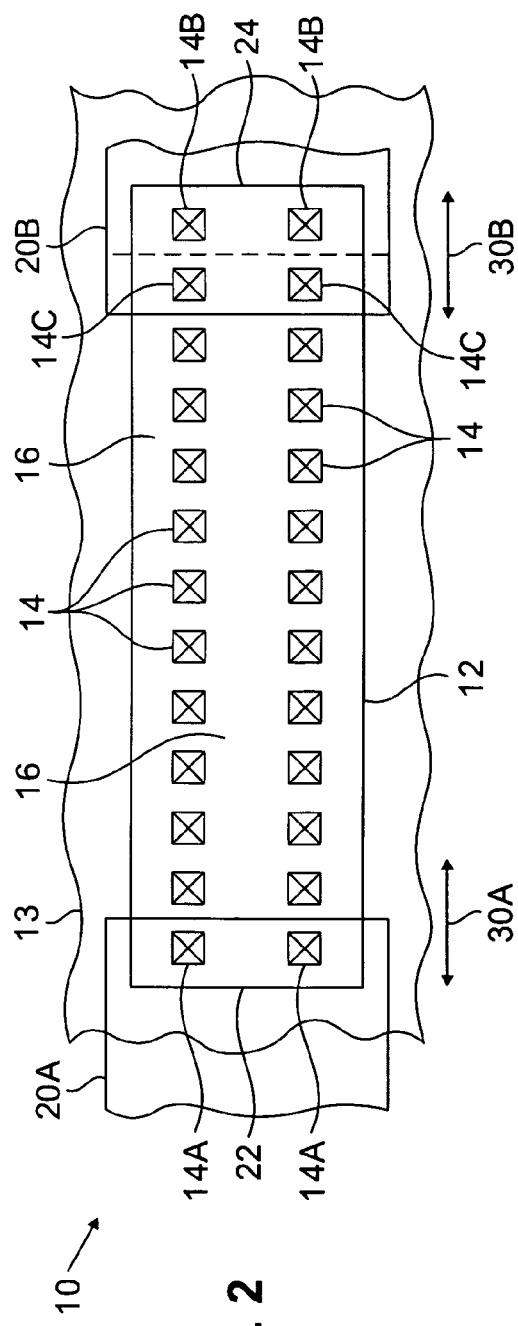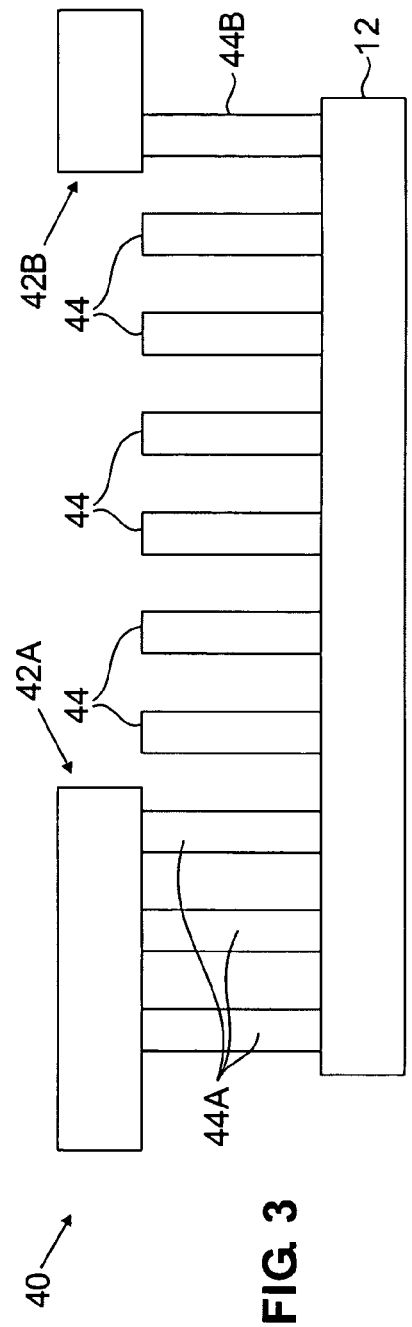

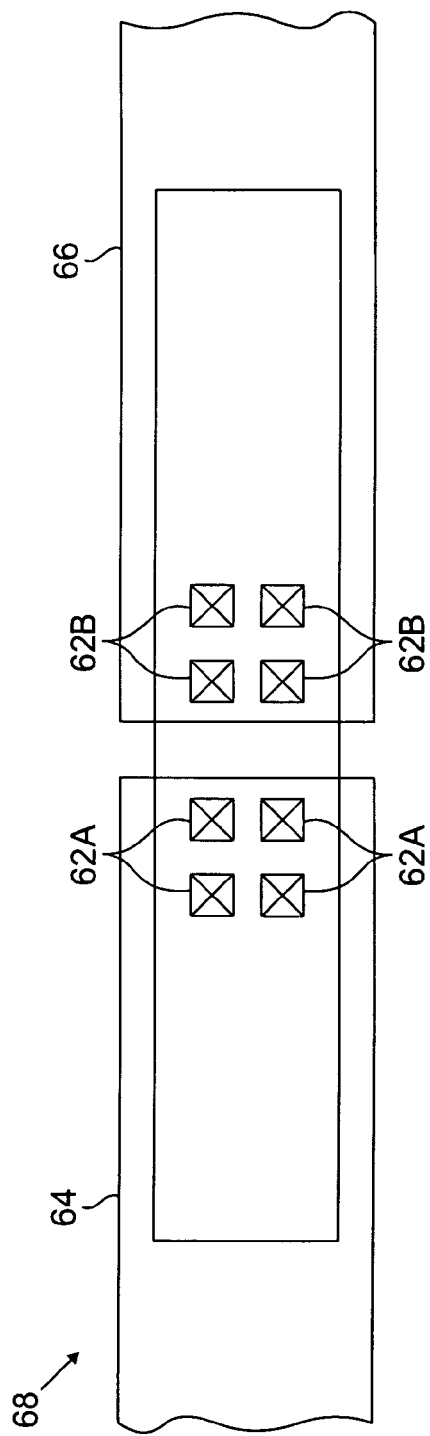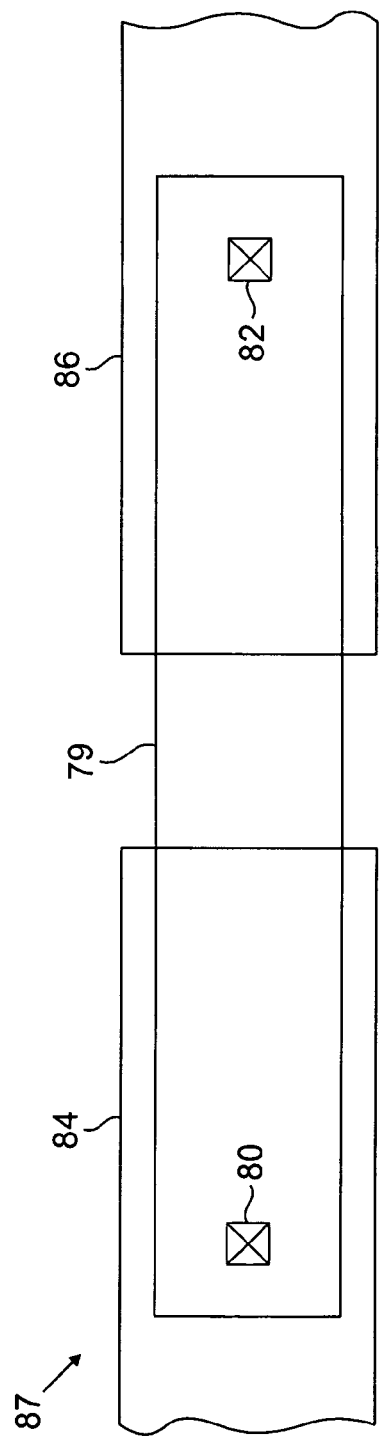

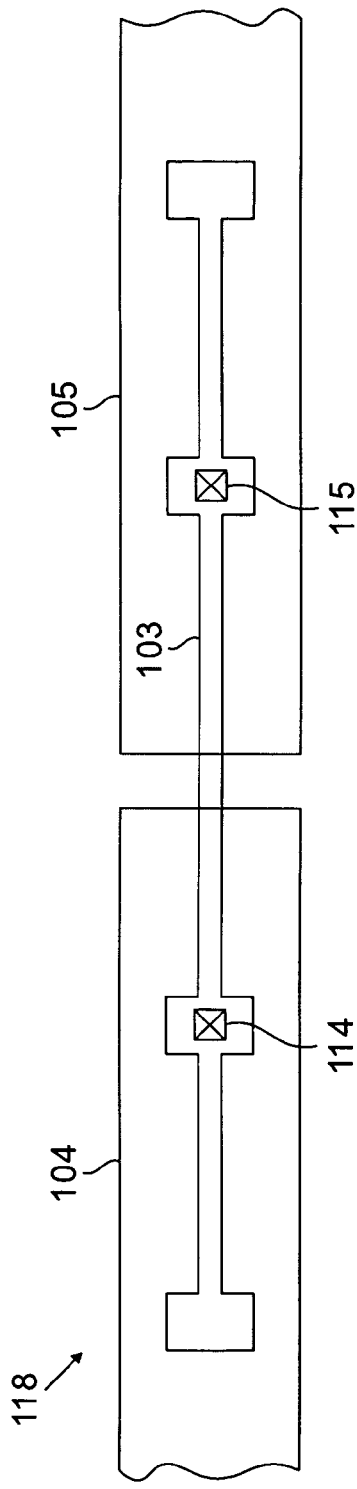
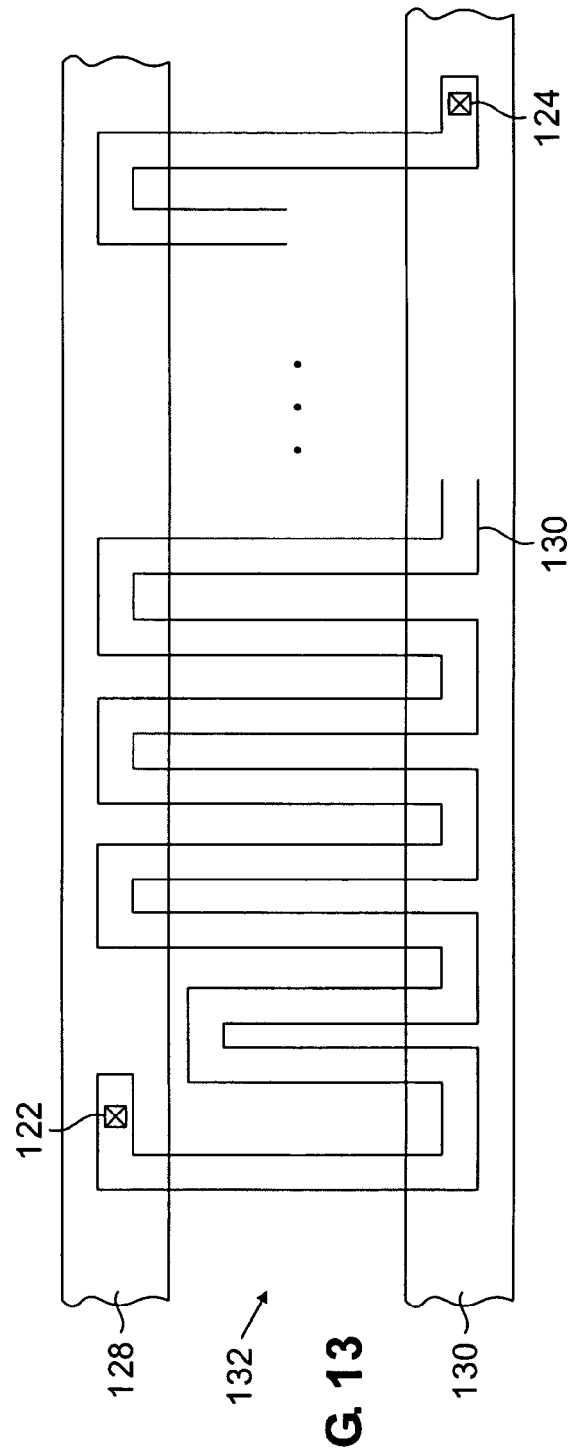
FIG. 12
FIG. 13

STRUCTURE AND METHOD FOR ADJUSTING INTEGRATED CIRCUIT RESISTOR VALUE

FIELD OF THE INVENTION

This invention relates generally to resistors formed in integrated circuits and specifically to an apparatus and method for adjusting a value of the resistor.

BACKGROUND OF THE INVENTION

Integrated circuits (also referred to as chips or die) typically comprise a silicon substrate and active semiconductor devices, such as transistors and diodes, and passive components, such as capacitors and resistors, formed from doped regions within the substrate. Passive components can also be formed in material layers overlying the substrate, e.g., polysilicon resistors formed in a polysilicon layer overlying the silicon substrate.

Interconnect structures, also formed in layers overlying the semiconductor substrate, electrically connect the doped regions and the passive components to form a functional integrated circuit. The interconnect structures comprise a plurality of stacked substantially horizontal conductive layers comprising conductive metal interconnect lines (referred to as metal layers) substantially parallel to an upper surface of the substrate. Two successive horizontal conductive layers are separated by a dielectric material layer. Vertical conductive plugs or vias formed in windows or openings of each dielectric layer connect the metal interconnect lines in an overlying and an underlying conductive layer. A topmost conductive layer (i.e., a top metallization layer) comprises conductive bond pads for receiving conductive elements (e.g., bond wires) for connecting the integrated circuit to externally-directed pins or leads of a package. The package also provides mechanical and environmental protection for the integrated circuit.

The process of forming the interconnect structures, referred to as metallization, includes deposition, photolithographic masking and patterning steps, and etching processes. The metal interconnect lines are formed by depositing a layer of conductive material over a dielectric layer and etching the conductive material according to a pattern formed therein during a photolithographic masking step. The openings in the dielectric layer for receiving the conductive plugs or vias are formed by an etch process that creates the openings according to a resist pattern formed on the dielectric layer according to a photolithographic mask. Conductive material is then deposited in the openings to form the conductive vias.

Integrated circuit fabrication comprises a plurality of depositing, doping, masking, patterning and material etching steps applied to a silicon substrate and material layers formed thereover. Certain of these steps utilize a photolithographic mask to define substrate regions that are to undergo subsequent processing steps, while complementary substrate regions are shielded from these processing steps. The mask comprises a stencil-like plate carrying a pattern of the regions to be processed. Light passing through pattern openings exposes a photosensitive resist material deposited on the substrate surface, changing the structure and properties of the resist and rendering the exposed regions soluble in a rinsing solution. After the exposed resist regions have been removed, processing is carried out on the exposed regions, while the unexposed resist regions shield the underlying material layers from the effects of these processing steps. The above exemplary patterning procedure employs a negative-acting resist. Those skilled in the art recognize that a similar pattering process can be carried out using a positive reacting resist and a mask that is complementary to a negative resist mask.

The sequence of processes for forming transistors, resistors, capacitors and other devices of the integrated circuit, including the interconnects, is referred to as a process flow. Once standardized, it is scaled up to manufacture a larger number of wafers. One element of integrated circuit design is to customize the process flow by creating masks to place and connect specific circuits.

An example of a typical circuit design work flow is illustrated in FIG. 1. During a design step 2, the designers prepare a circuit schematic and generate photomasks for the fabrication facility to use in a process flow for fabricating integrated circuits on a wafer lot. Generally, the process flow is divided into a front-end-of-line (FEOL), primarily comprising the process steps before dielectric deposition and metallization, and the back-end-of-line (BEOL), comprising the remaining steps, including metallization.

After a wafer lot is processed through an FEOL step 3, some of the wafers are split from the lot and held for later processing, as indicated at a step 4. The remaining wafers are processed through the BEOL at a step 5. The processed wafers are tested at a step 6 to ensure that the circuits formed thereon satisfy the applicable specifications. If not, the design is refined at a step 7 during which new masks are generated to reflect the new design. Often, these mask changes affect only BEOL masks, in which case the set aside wafer lot is processed through the redesigned BEOL at a step 8 using the new masks. The set-aside wafers are tested at a step 9. The original circuit design may include provisions to accommodate design changes after testing, such that the changes require modifications to the BEOL masks only.

As is known in the art, the processes employed to design and fabricate each mask are time intensive and expensive. All integrated circuit fabricators expend considerable effort to limit the number of masking steps in the fabrication process flow and to avoid mask changes. As with any fabrication or manufacturing process, it is obvious that integrated circuit redesign time and costs must be minimized.

One specific aspect of circuit redesign involves changing resistor values. In one prior art approach, an integrated circuit includes a plurality of spare resistors having different values. If it is required to change a resistor value, the interconnect structures are adjusted (by using a redesigned mask) to connect a different resistor, selected from among the spare resistors, in place of the resistor used in the original design. Series and parallel combinations of the spare resistors can also be formed to produce a composite resistor having the desired resistance. These series and parallel combinations are also created by modifying the interconnect structures and the masks used to create those structures.

Disadvantageously, a range of available resistances may be limited as in practice the number of spare resistors of different resistance values that can be readily and practically fabricated in the integrated circuit is relatively small. Also, it may be difficult to modify the interconnect structures to accommodate a different resistor, and further the modification may involve changing interconnect structures on multiple interconnect levels. Thus inserting a different resistor into the circuit may require layout-intensive changes that consume considerable time and risk introducing errors into the integrated circuit.

According to another prior art approach, a resistor value is modified by adjusting a length or a width of material from which the resistor is formed according to an original mask. For example, a resistor formed from a polysilicon bar having a length of 10 microns and a width of 1.6 microns presents a certain resistance value based on the dimensions and properties of the polysilicon material disposed between a first and a second resistor contact. The resistance can be adjusted, as required by circuit design modifications, to a lower value by reducing the length of the polysilicon material disposed between the two contacts (e.g., to 8 microns), which is accomplished by relocating at least one of the contacts. Conversely, the resistance can be modified to a higher value by moving the contacts farther apart, i.e., by moving at least one of the contacts.

Either of these resistance changes to increase or decrease the resistance requires at least three mask changes. The mask used to form the polysilicon material must be modified to form either a longer or a shorter polysilicon bar. The resistor contacts are formed according to patterned openings in a material layer overlying the polysilicon bar. Since in both cases at least one of the contacts is relocated, a second mask change is required to realize contact relocation. Finally, at its upper end, each contact is in electrical communication with an overlying interconnect layer (i.e., a conductive line) to electrically connect the contact, and thus the resistor, into a circuit of the integrated circuit. Since at least one contact is relocated, it is necessary to modify the mask for forming the overlying interconnect lines to contact the contacts at the new location. Thus three mask changes are required to change a single resistance value. Also, integrated circuit resistors are typically placed in arrays with a minimum required resistor spacing or a minimum distance to adjacent circuit elements. Increasing the length or width of the resistive material may require changes to several layers and thus several masks, in addition to the mask used for forming the material.

After the new masks are designed, wafers are processed using the new mask set. But since these mask change may involve one or more FEOL masks (e.g., the mask for forming the polysilicon bar), use of the staged wafers as depicted in FIG. 1 does not save process flow cycle time, and a new wafer lot must be processed to implement the resistance changes.

SUMMARY OF THE INVENTION

A first embodiment of the invention comprises a resistor comprising a bar of resistive material, a dielectric material layer disposed over the bar, a plurality of contacts disposed in the dielectric material layer and having a lower end in electrical contact with the bar; and a first and a second interconnect structure disposed over the dielectric material layer, each in electrical contact with an upper end of a first and a second contact of the plurality of contacts, such that an electrical current path is formed from the first interconnect structure, through the first contact, a current-carrying region of the bar and the second contact to the second interconnect structure, and wherein the first and the second contacts are disposed relative to the plurality of contacts to provide a predetermined resistance through the current-carrying region of the bar.

Another embodiment of the present invention comprises a method for forming an integrated circuit resistor, further comprising: providing a substrate; forming a resistive material on a material layer overlying the substrate; forming a dielectric layer overlying the resistive material; forming a plurality of conductive structures extending from a top surface to a bottom surface of the dielectric layer, wherein a lower end of each one of the plurality of conductive structures is in electrical contact with the resistive material; forming a first interconnect line overlying the dielectric layer and in electrical contact with one or more first conductive structures of the plurality of conductive structures; and forming a second interconnect line overlying the dielectric layer and in electrical contact with one or more second conductive structures of the plurality of conductive structures, wherein a predetermined resistance is presented by the resistive material between the first and the second interconnect lines.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 2 illustrates a plan view of an integrated circuit resistor constructed according to the teachings of the present invention.

FIGS. 3 and 4 illustrate a cross-sectional view and a plan view of an integrated circuit resistor according to another embodiment of the present invention.

FIGS. 7–14 illustrate plan views of resistors constructed according to other embodiments of the present invention.

DESCRIPTION OF THE INVENTION

Figure 1:
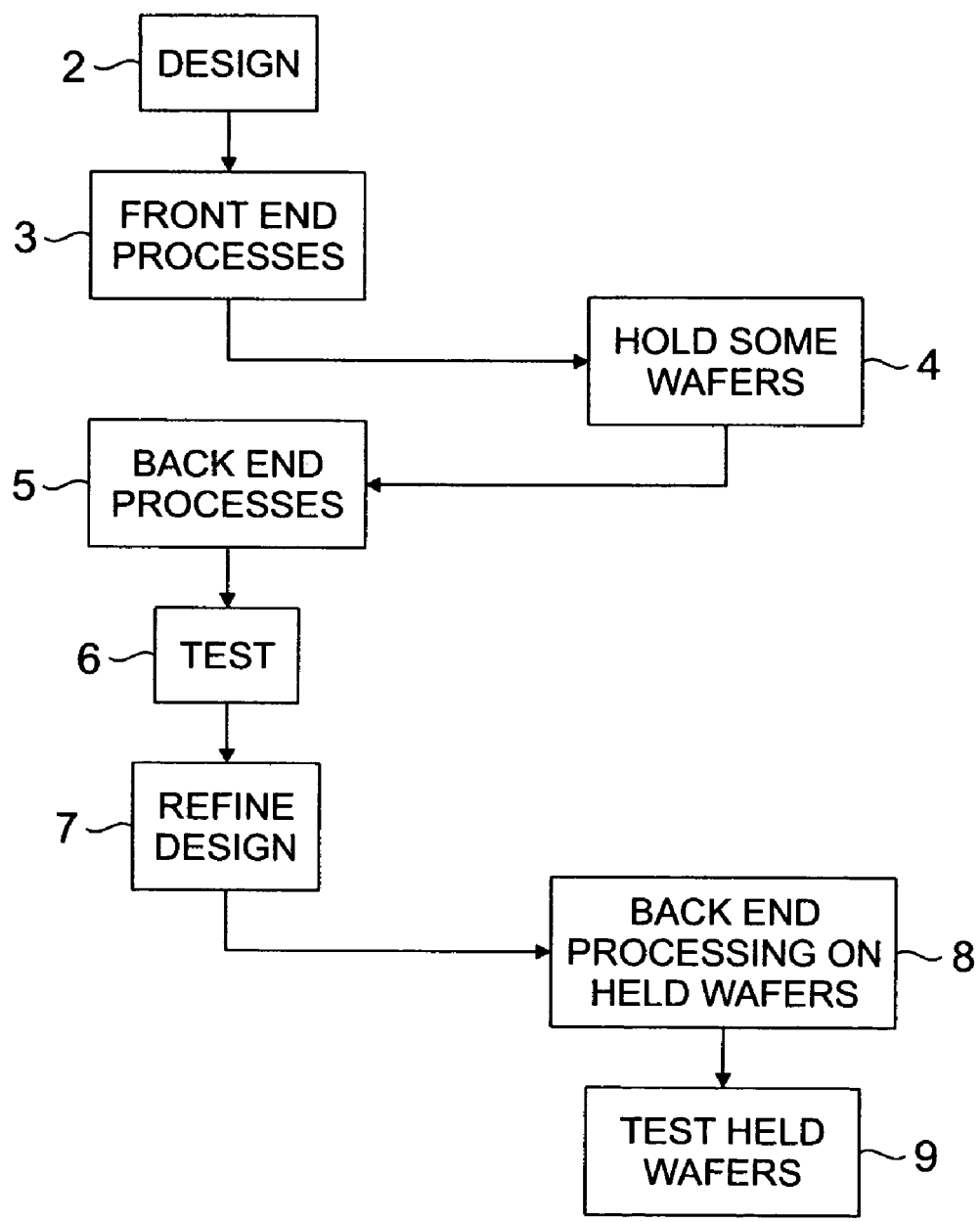
FIG. 1 illustrates a process flow chart for forming an integrated circuit.

Before describing in detail the particular structure and method for adjusting resistor values in an integrated circuit, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

In conjunction with the description of the present invention, the term "window-1" layer refers to an interconnect structure formed in a first dielectric layer and comprising conductive vias or plugs in electrical contact with resistive material and other elements formed in the semiconductor substrate. "Metal-1" refers to an interconnect structure layer comprising metal interconnect lines overlying the window-1 layer for interconnecting the plurality of window-1 conductive vias or plugs and for connecting the conductive vias and plugs to window-2 conductive vias or plugs formed in a second dielectric layer overlying the metal-1 layer. "Metal-1" also refers to the conductive pads formed in a topmost metallization layer of the integrated circuit.

As those skilled in the art recognize, in the case of a thin-film resistor disposed in a dielectric layer X, a window (X+1) layer and metal (X+1) layer refer to an overlying dielectric layer in which conductive plugs are formed and the overlying metal interconnect structure layer, respectively. A resistor constructed according to the present invention can be formed in any of these layers, with conductive plugs formed thereover serving as resistor contacts, and interconnect lines formed overlying the conductive plugs for connecting the plugs to other circuit elements.

The present invention teaches a method and apparatus for easily and quickly adjusting a resistance value in an integrated circuit, expending minimal design and layout time and expense, and minimizing the number of new photolithographic masks that must be created to realize the resistance change. The teachings of the present invention can be applied to resistors fabricated from various materials, such as unsilicided and silicided polysilicon (both doped and undoped), n+ active material, p+ active material and thin-film metal material. Generally, the teachings apply to substantially uniform resistors without separate head and body regions.

As shown in a FIG. 2 plan view, a resistor 10 is formed from a bar 12 comprising a resistive material, such as polysilicon, formed over a material layer 13. The bar 12 comprises a plurality of contacts or conductive vias 14 formed in a window-1 dielectric layer of an integrated circuit and disposed along an entire length of the bar 12. A desired resistance for the resistor 10 is achieved by selection of appropriate contacts 14 to serve as opposing terminals of the resistor 10, and thus establish a resistance based on the dimensions and resistive properties of a region of the bar 12 between the terminals.

To realize the desired resistance and connect the resistor 10 to other elements of the integrated circuit, an interconnect metal line 20A formed in the metal-1 layer is disposed to contact a last row 14A of the plurality of contacts 14 at a first end 22 of the bar 12. An interconnect metal line 20B of the metal-1 layer is disposed to cover and form an electrical connection to the contacts 14B and 14C at a second end 24 of the bar 12 such that a region 16 of the bar 12 between the metal lines 20A and 20B provides the desired resistance.

A position of the metal lines 20A and 20B can be adjusted in a direction of the arrowheads 30A and 30B to change the resistance value as desired, by contacting different ones of the contacts 14. Changes associated with a location of the metal lines 20A and/or 20B are accomplished by creating a new mask for the metal-1 layer.

For example, if a redesign of the integrated circuit requires a higher resistance value for the resistor 10, the metal line 20B can be adjusted to the right (with the new position indicated by the dashed line) to contact the contacts 14B (but not the contacts 14C), increasing a length of the region 16 disposed between the metal lines 20A and 20B and thus the resistance of the resistor 10. The resistance can also be increased by relocating the metal line 20A to the left.

The resistance can be adjusted to a lower value by adjusting the metal line 20A to the right or the metal line 20B to the left. Either of these adjustments causes the metal lines 20A and 20B to contact other of the plurality of contacts 14 to shorten a length of the region 16 between the metal lines 20A and 20B and lower the resistance of the resistor 10. Thus, by displacing the metal-1 interconnect lines relative to the window-1 contacts a desired resistance value can be obtained. According to the present invention, only one mask change (for the metal-1 layer) is required to change the resistance of the resistor 10.

The plurality of contacts 14 can be disposed at desired locations along the resistive bar 12. It is not necessary that the plurality of contacts 14 span an entire length of the bar 12 or be placed in a regular and/or repeating pattern. Advantageously, the contacts 14 should be placed to permit realization of a resistor over a wide range of resistance values as might be required for the integrated circuit.

As illustrated in a cross-sectional view of FIG. 3, a resistor 40 comprises a metal line 42A formed in a metal-1 layer in electrical contact with a plurality of contacts or conductive vias 44A and a metal line 42B in the metal-1 layer in electrical contact with at least one contact 44B. Thus a region 46 of the resistive bar 12 between the metal lines 42A and 42B determines a resistance of the resistor 40.

Figure 4:
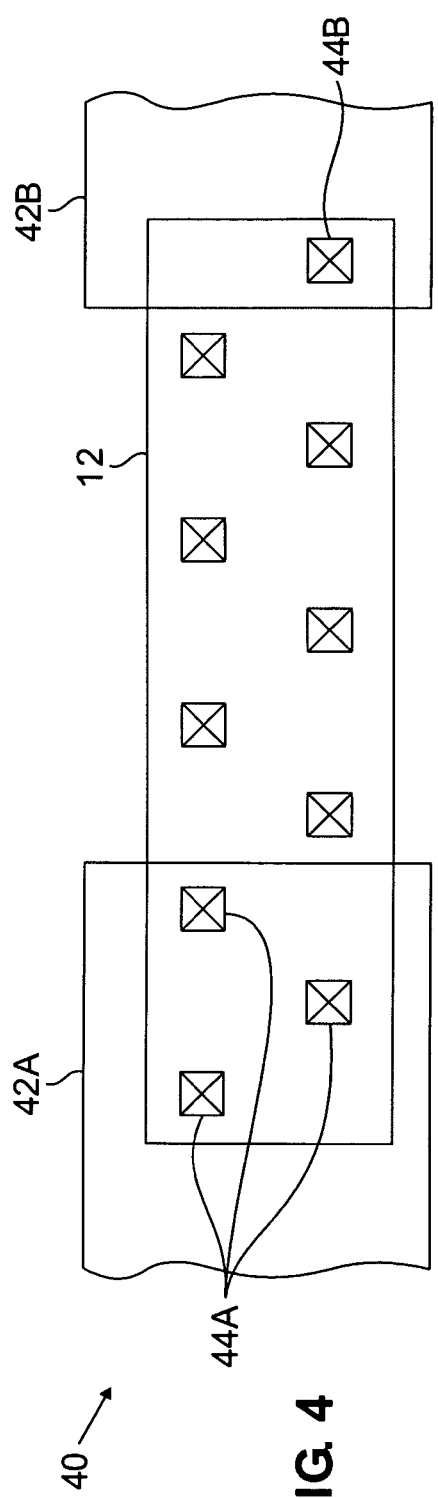

FIG. 4 is a plan view of the resistor 40 of FIG. 3. In this embodiment, the window-1 conductive vias 44 are disposed on the resistive bar 12 in a staggered pattern to permit realization of various resistance values.

Placement of the conductive vias 44 is flexible, within the fabrication process design rules for the integrated circuit. For example, in another embodiment (not illustrated) the conductive vias are arranged in a pattern comprising a single linear row. In another embodiment, the pattern comprises multiple linear rows, with FIG. 2 depicting two linear rows. The contacts can also be arranged in a non-linear or staggered pattern with as many rows and columns as desired and as permitted by the design rules. In yet another embodiment, the conductive vias are located based on resistance values that may be required in the integrated circuit, the space available on the resistive bar and a desired resolution for the resistance values. For example, a first exemplary bar 12 and the plurality of contacts 14 is constructed to provide resistance values in a range of 30 to 50 ohms in 2 ohm increments. A second exemplary bar is constructed to provide resistance values in a range of 1000 to 10,000 ohms in 1000 ohm increments. To realize the desired resistance values, the dimensions of the bar 12 and the location of the conductive vias 44 on the bar 12 will differ between the first and the second exemplary bars.

Figure 5:
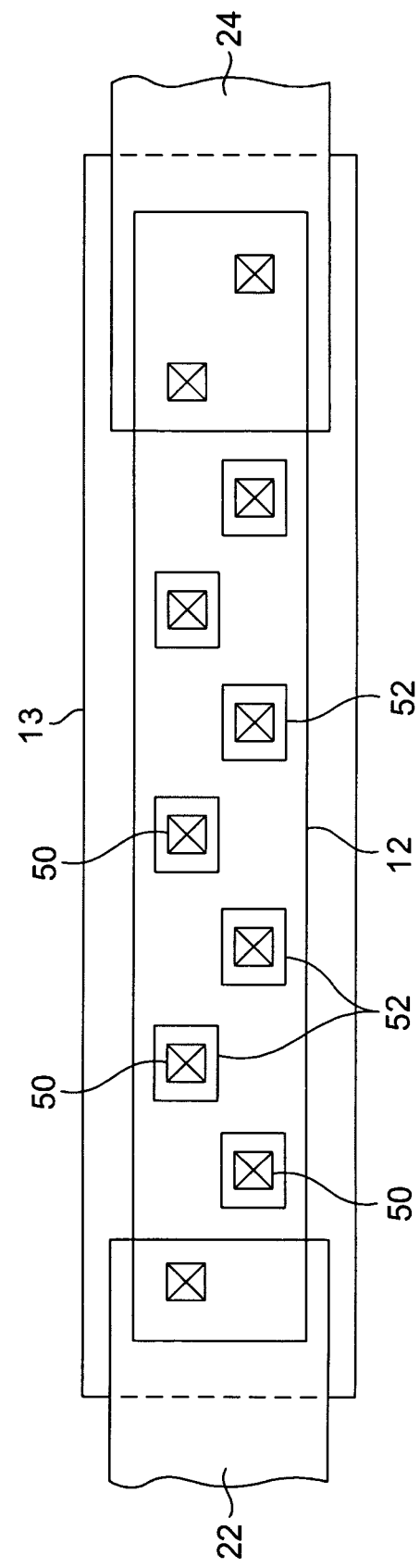
FIGS. 5 and 6 illustrate a plan view and a cross-sectional view of an integrated circuit resistor constructed according to another embodiment of the present invention.
Figure 6:
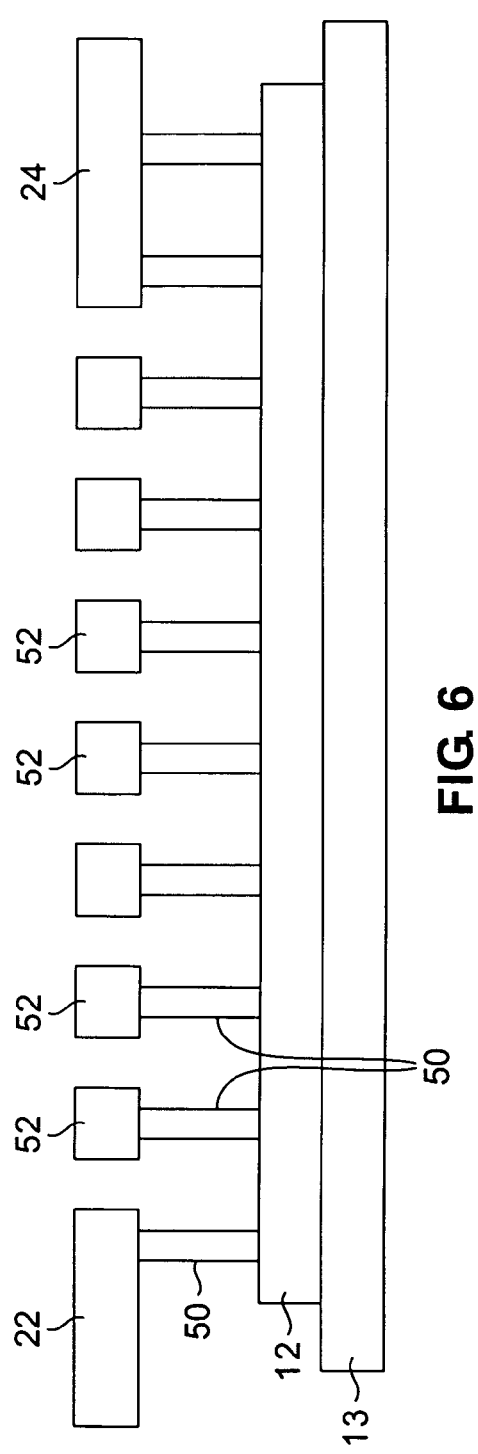

According to certain fabrication process design rules, uncovered conductive plugs in the window-1 layer, that is, a conductive plug without an overlying metal-1 interconnect structure, are not permitted. See conductive plugs 50 in FIG. 5 (plan view) and FIG. 6 (cross-section). To accommodate this requirement, in one embodiment, separate metal-1 interconnect structures 52 are formed in contact with each wndow-1 conductive plug 50, but certain of the individual metal-1 interconnect structures 52 remain open-circuited.

Figure 7:
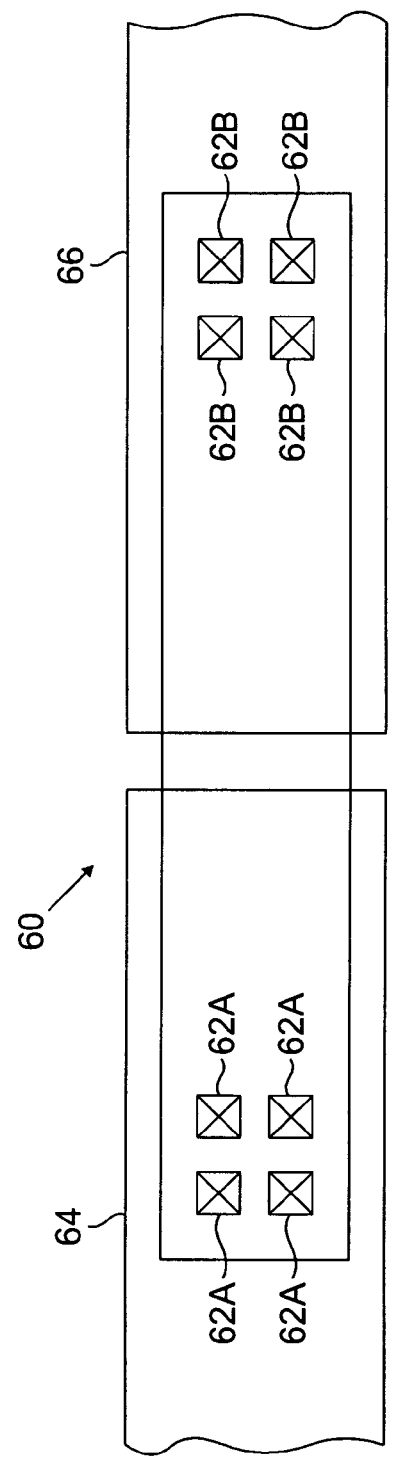

According to another embodiment of the present invention, the resistance of a resistor is selected by fixing a location of the metal-1 lines above the resistor and selecting a location for the window-1 contacts or conductive vias. See FIG. 7, where a resistor 60 comprises window-1 contacts 62A and 62B with corresponding metal-1 interconnect lines 64 and 66. According to this embodiment, the resistance is changed by relocating the contacts 62A and 62B, as illustrated in FIG. 8. Relocation is accomplished by redesigning the mask required to form the window-1 contacts 62A and 62B. In FIG. 8, a resistor 68 has lower resistance than the resistor 60 of FIG. 7 due to displacement of the contacts 62A and 62B from their positions in FIG. 7 to their positions in FIG. 8. The metal-1 interconnect lines 64 and 66 remain unchanged from the FIG. 7 to the FIG. 8 embodiment.

Figure 10:
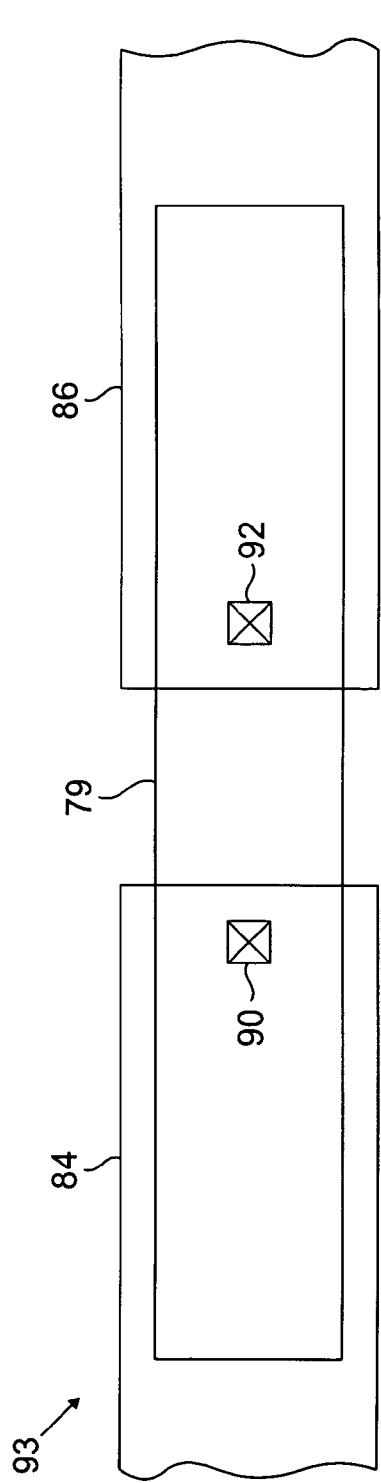

FIGS. 9 and 10 illustrate another embodiment of the present invention comprising contacts or conductive vias 80 and 82 formed in a window-1 layer and disposed proximate terminal ends of a resistive bar 79, as illustrated in FIG. 9. The contacts 80 and 82 are in electrical contact with overlying interconnect lines 84 and 86, respectively, to form a resistor 87. To change the resistance presented by the resistive bar 79, in the FIG. 10 embodiment the conductive vias 80 and 82 are replaced by conductive vias or contacts 90 and 92 that span a shorter length of the bar 79 and thus present a lower resistance for a resistor 93 than the resistance presented by the resistor 87.

Figure 11:
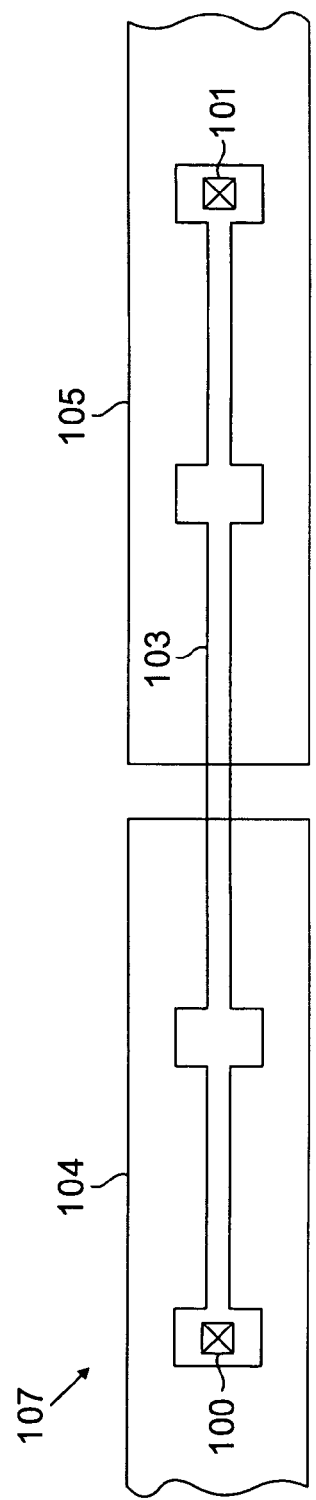

In certain semiconductor processes, a contact width is greater than a width of the resistive bar, as shown in FIG. 11, depicting a contacts 100 and 101 each having a first terminal end in electrical contact with a resistive bar 103 and a second terminal end in electrical contact with an overlying interconnect line 104 and 105, respectively, forming a resistor 107.

In an embodiment of FIG. 12, contacts 114 and 115 are connected to the resistive bar 103 and the interconnect lines 104 and 105 to form a resistor 118. Due to a shorter distance between the contacts 104 and 105 than the contacts 100 and 101, the resistor 118 has a lower resistance than the resistor 107.

Figure 14:
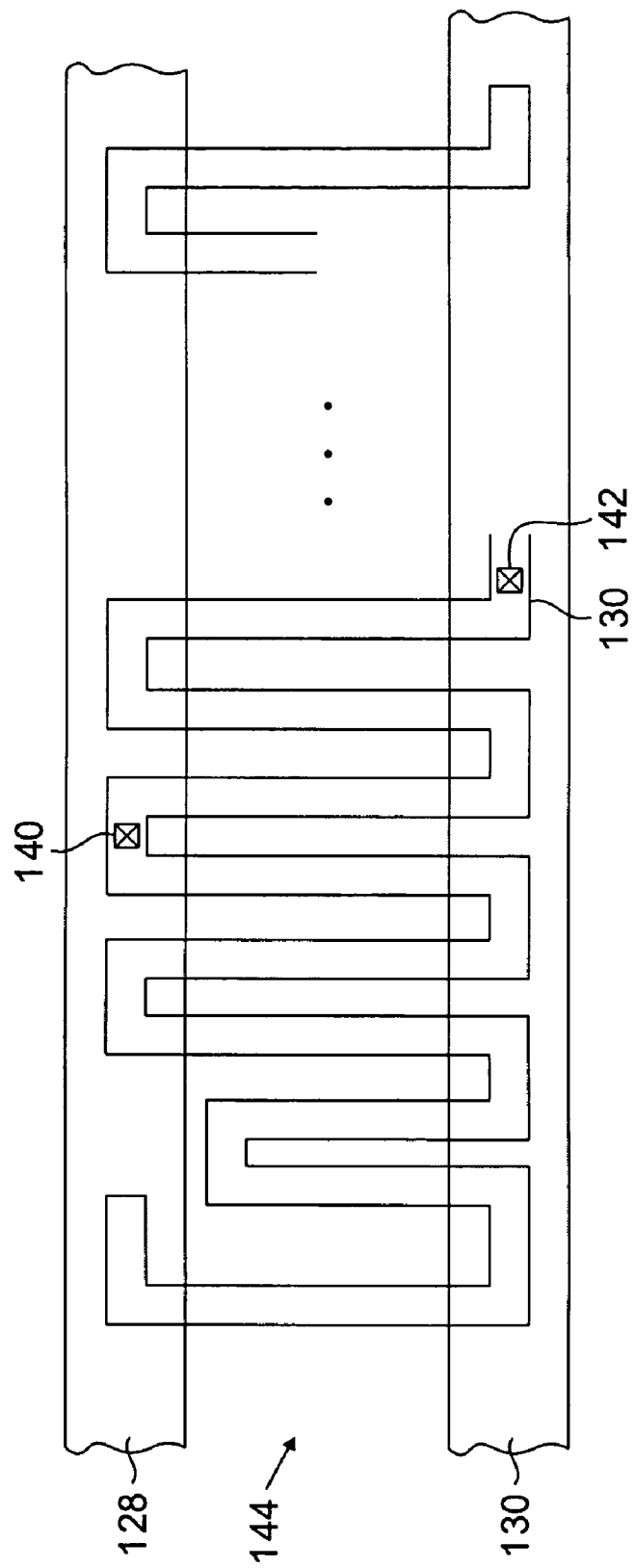

FIGS. 13 and 14 illustrate an embodiment comprising a serpentine-shaped resistive bar 130. In the FIG. 13 embodiment contacts 122 and 124 electrically contact the bar 130 at a lower terminal end of each contact and electrically contact overlying metal interconnect lines 128 and 130, respectively, to form a resistor 132. In the FIG. 14 embodiment contacts 140 and 142, which are spaced closer than the contacts 122 and 124, form a resistor 144 having a lower resistance than the resistor 132. The illustrated serpentine shape is merely exemplary, as those skilled in the art recognize that the resistive bar can be formed in various shapes as permitted by the employed fabrication process.

As can be seen, according to the teachings of the present invention, a resistor value can be changed by modifying a location of the metal-1 layer with reference to contacts in the widow-1 layer and in electrical contact with the resistive material. Thus, only one mask change is required. Expenses associated with the re-layout, fracturing, and ordering of multiple metal layer and window layer masks are avoided, and the invention reduces the redesign process cost when a resistance modification is required. Alternatively, a resistance value can be changed by moving the window-1 contacts relative to the overlying metal-1 interconnect line. In this embodiment also, only one mask change is required. For wafer lots staged at the metal-1 or window-1 process step, according to the present invention, resistances can be changed without a need to change multiple metal and window masks. Also, adoption of the teachings of the present invention avoids the need to form spare resistors on integrated circuits, thereby preserving chip area. The teachings of the present invention can be incorporated into an integrated circuit design kit, which can automate the use of resistors formed according to the inventive techniques.

The teachings of the present invention can be applied to other devices, such as a spiral inductor disposed in an integrated circuit. A desired inductor length (which affects the inductance due to flux linkage between inductor turns) is selected by appropriate placement of the window layer contacts along the inductor spiral. It is known that the inductor may be formed in a layer other than a layer immediately below the window-1 layer (i.e., immediately below a window-x layer) and the contacts can be formed in a window layer above the window-x layer. The metal interconnect lines for electrically connecting to the contacts are formed in an interconnect layer overlying the layer in which the contacts are disposed.

While the present invention has been described with reference to preferred embodiments, it will be understood by those skilled in the art that various changes may be made and equivalent elements may be substituted for the elements thereof without departing from the scope of the present invention. The scope of the present invention further includes any combination of elements from the various embodiments set forth herein. In addition, modifications may be made to adapt a particular situation to the teachings of the present invention without departing from its essential scope. For example, the teachings of the present invention are not limited in application to a resistor, but can also be applied to other passive and active components where placement of one or more contacts for the components affect a component operating characteristic. Therefore, it is intended that the invention not be limited to the particular embodiments disclosed, but that the invention will include all embodiments falling within the scope of the appended claims.

What is claimed is:

1. An integrated circuit comprising:
   a semiconductor substrate having doped regions therein;
   a plurality of material dielectric layers overlying the substrate;
   a region of resistive material disposed over one of the material layers;
   a plurality of contacts formed in a dielectric layer of the plurality of material layers, wherein the plurality of contacts is formed in a plurality of rows arranged in a staggered pattern and wherein the plurality of contacts are in electrical contact with the resistive material at their ends;
   a first interconnect line overlying the dielectric layer and in electrical contact with a first subset of the plurality of contacts; and
   a second interconnect line overlying the dielectric layer and in electrical contact with a second subset of the plurality of contacts, and wherein the first subset and the second subset of contacts are disposed relative to the plurality of contacts to provide a predetermined resistance between the first and the second interconnect lines through the resistive material.

2. The integrated circuit of claim 1 wherein the resistive material is selected from among polysilicon, a material doped n-type, a material doped p-type and a thin film metal.

3. The integrated circuit of claim 1 wherein the first and the second interconnect lines each comprise a metal interconnect line of an integrated circuit interconnect structure.

4. The integrated circuit of claim 1 wherein the first and the second subsets of the plurality of contacts are disposed relative to the plurality of contacts, such that the predetermined resistance is presented by a region of the resistive material between the first and the second subsets of the plurality of contacts.

5. The integrated circuit of claim 1 wherein the dielectric layer comprises a window-1 layer and the first and the second interconnect lines are formed in a metal-1 layer.

6. The integrated circuit of claim 1 wherein the resistive material comprises an elongated bar of resistive material.

7. The integrated circuit of claim 1 wherein the resistive material comprises a serpentine shaped bar of resistive material.

8. The integrated circuit of claim 1 wherein dimensions of a region of the resistive material disposed between the first and the second subsets of the plurality of contacts determine a resistance presented between the first and the second interconnect lines.

9. The integrated circuit of claim 1 wherein a location for the plurality of contacts on the resistive material is determined to provide a desired range of resistance values between a minimum resistance and a maximum resistance, wherein the minimum resistance is obtained when the first and the second subsets of the plurality of contacts comprise the closest spaced contacts from among the plurality of contacts, and wherein the maximum resistance is obtained when the first and the second subsets of the plurality of contacts comprises the farthest spaced contacts from among the plurality of contacts.

10. The integrated circuit of claim 1 wherein a location for the plurality of contacts on the resistive material is determined to provide a desired resistance increment by selecting different ones of the plurality of contacts for the first and the second subsets of the plurality of contacts.

11. An integrated circuit comprising:
a semiconductor substrate having doped regions therein;
a plurality of material layers overlying the substrate;
a region of resistive material disposed over one of the material layers;
a plurality of contacts formed in a dielectric layer of the plurality of material layers, wherein the plurality of contacts is formed in a plurality of rows arranged in a staggered pattern and wherein the plurality of contacts are in electrical contact with the resistive material at their lower ends;
a first interconnect line overlying the dielectric layer and in electrical contact with a first subset of the plurality of contacts; and
a second interconnect line overlying the dielectric layer and in electrical contact with a second subset of the plurality of contacts;
a third subset of the plurality of contacts disposed between the first and the second subsets, wherein contacts comprising the third subset are open circuit contacts.

12. The integrated circuit of claim 11 wherein the resistive material is selected from among polysilicon, a material doped n-type, a material doped p-type and a thin film metal.

13. The integrated circuit of claim 11 wherein the first and the second interconnect lines each comprise a metal interconnect line of an integrated circuit interconnect structure.

14. The integrated circuit of claim 11 wherein the third subset of the plurality of contacts is disposed relative to the first and the second subsets such that a predetermined resistance is presented by a region of the resistive material between the first and the second subsets of the plurality of contacts.

15. The integrated circuit of claim 11 wherein the dielectric layer comprises a window-X layer and the first and the second interconnect lines are formed in a metal-X layer.

16. The integrated circuit of claim 11 wherein dimensions of a region of the resistive material disposed between the first and the second subsets of the plurality of contacts determine a resistance presented between the first and the second interconnect lines.

17. The integrated circuit of claim 11 wherein a location for the plurality of contacts on the resistive material is determined to provide a desired range of resistance values between a minimum resistance and a maximum resistance, wherein the minimum resistance is obtained when the first and the second subsets of the plurality of contacts comprise the closest spaced contacts from among the plurality of contacts, and wherein the maximum resistance is obtained when the first and the second subsets of the plurality of contacts comprises the farthest spaced contacts from among the plurality of contacts.

18. The integrated circuit of claim 11 wherein a location for the plurality of contacts on the resistive material is determined to provide a desired resistance increment by selecting different ones of the plurality of contacts for the first and the second subsets of the plurality of contacts.

19. A method for forming an integrated circuit resistor, comprising:
providing a substrate;
forming a resistive material on a material layer overlying the substrate;
forming a dielectric layer overlying the resistive material;
forming a plurality of conductive structures extending from a top surface to a bottom surface of the dielectric layer, wherein the plurality of conductive structures is formed in a plurality of rows arranged in a staggered pattern and wherein a lower end of each one of the plurality of conductive structures is in electrical contact with the resistive material;
forming a first interconnect line overlying the dielectric layer and in electrical contact with one or more first conductive structures of the plurality of conductive structures; and
forming a second interconnect line overlying the dielectric layer and in electrical contact with one or more second conductive structures of the plurality of conductive structures, wherein a predetermined resistance is presented by the resistive material between the first and the second interconnect lines.

20. The method of claim 19 wherein the steps of forming the first and the second interconnect lines comprise forming a conductive layer overlying the dielectric layer and removing regions of the conductive layer, and wherein retained regions of the conductive layer comprise the first and the second interconnect lines disposed relative to the one or more first and second conductive structures such that the resistive material presents the predetermined resistance between the first and the second interconnect lines.

21. The method of claim 20 wherein the predetermined resistance is changed by altering the retained regions of the conductive layer comprising the first and the second interconnect lines by forming the first and the second interconnect lines in electrical contact with different ones of the plurality of conductive structures other than the one or more first and second conductive structures.

22. The method of claim 20 wherein the step of removing regions of the conductive layer comprises patterning the conductive layer into removed regions and the retained regions using a photolithographic mask.

23. The method of claim 19 wherein the step of forming the plurality of conductive structures comprises determining a location of the plurality of conductive structures using a photolithographic mask, and wherein the method further comprises changing the predetermined resistance between the first and the second interconnect lines by altering the photolithographic mask to change the location of the plurality of conductive structures.

24. The method of claim 19 further comprising selecting the one or more first and second conductive structures from among the plurality of conductive structures to form a current-carrying region of the resistive material therebetween, wherein the predetermined resistance is presented by the resistive material between the selected one or more first and second conductive structures.

25. A method for forming an integrated circuit resistor, comprising:
providing a substrate;
forming a resistive material on a material layer overlying the substrate;
forming a dielectric layer overlying the resistive material;
creating a first mask;

forming a plurality of conductive structures using the first mask, wherein the plurality of conductive structures is formed in a plurality of rows arranged in a staggered pattern and wherein each one of the plurality of conductive structures extends through the dielectric layer and comprises a lower end in electrical contact with the resistive material;

creating a second mask;

forming a first interconnect line using the second mask, wherein the first interconnect line overlies the dielectric layer and is in electrical contact with one or more first conductive structures of the plurality of conductive structures; and forming a second interconnect line using the second mask, wherein the second interconnect line overlies the dielectric layer and is in electrical contact with one or more second conductive structures of the plurality of conductive structures, wherein a resistance is presented by the resistive material between the first and the second interconnect lines.

26. The method of claim 25 further comprising creating a third mask, wherein the step of forming the plurality of conductive structures is executed using the third mask to relocate one or more of the plurality of conductive structures to change the resistance presented by the resistive material.

27. The method of claim 25 further comprising creating a third mask, wherein the steps of forming the first and the second interconnect lines are executed using the third mask to relocate at least one of the first and the second interconnect lines relative to the plurality of conductive structures to change the resistance presented by the resistive material.

* * * * *